(12) United States Patent
Shao et al.

(10) Patent No.: US 8,974,649 B2
(45) Date of Patent: Mar. 10, 2015

(54) COMBINATORIAL RF BIAS METHOD FOR PVD

(75) Inventors: ShouQian Shao, Fremont, CA (US); Kent Riley Child, Dublin, CA (US); James Tsung, Milpitas, CA (US); Hong Sheng Yang, Pleasanton, CA (US)

(73) Assignee: Intermolecular, Inc., San Jose, CA (US)

( * ) Notice: Subject to any disclaimer, the term of this patent is extended or adjusted under 35 U.S.C. 154(b) by 173 days.

(21) Appl. No.: 13/316,882

(22) Filed: Dec. 12, 2011

(65) Prior Publication Data

US 2013/0149469 A1    Jun. 13, 2013

(51) Int. Cl.
*C23C 14/00*     (2006.01)
*C25B 11/00*     (2006.01)
*C25B 13/00*     (2006.01)

(52) U.S. Cl.
USPC .................. 204/298.11; 204/298.08

(58) Field of Classification Search
CPC ................................ H01J 37/32651
USPC ....................... 204/298.11, 298.08
See application file for complete search history.

(56) References Cited

U.S. PATENT DOCUMENTS

| | | | | |
|---|---|---|---|---|
| 4,392,932 A | * | 7/1983 | Harra | 204/192.32 |
| 6,117,279 A | * | 9/2000 | Smolanoff et al. | 204/192.12 |
| 2009/0061087 A1 | * | 3/2009 | Endo et al. | 427/255.5 |

* cited by examiner

*Primary Examiner* — Keith Hendricks
*Assistant Examiner* — Ibrahime A Abraham

(57) ABSTRACT

In some embodiments of the present invention, a shield is provided wherein the shield comprises a ceramic insulation material. The ceramic insulation material fills the space between the shield and the substrate surface and maintains a gap of less than about 2 mm and advantageously, less than about 1 mm. The shield may further be connected to ground through a low-pass filter operable to prevent the loss of high frequency RF power through the shield to ground but allow the dissipation of charge from the shield to ground through a low frequency or DC signal. In some embodiments, the ceramic insulating material further comprises a removable ceramic insert. The ceramic insert may be used to select the size of the aperture. The ceramic insert further comprises a slot operable to isolate the bottom lip of the ceramic insert from the upper portion for a PVD deposition.

17 Claims, 7 Drawing Sheets

COMBINATORIAL RF BIAS METHOD FOR PVD

FIELD OF THE INVENTION

The present invention relates generally to apparatus for applying an RF bias to a substrate in a sputtering system configured for combinatorial processing.

BACKGROUND OF THE INVENTION

Physical vapor deposition is commonly used within the semiconductor industry, as well as within solar, glass coating, and other industries, in order to deposit a layer over a substrate. Sputtering is a common physical vapor deposition method, where atoms or molecules are ejected from a target material by high-energy particle bombardment and then deposited onto the substrate.

The manufacture of integrated circuits (IC), semiconductor devices, flat panel displays, optoelectronics devices, data storage devices, magneto-electronic devices, magneto-optic devices, packaged devices, and the like entails the integration and sequencing of many unit processing steps. As an example, IC manufacturing typically includes a series of processing steps such as cleaning, surface preparation, deposition, lithography, patterning, etching, planarization, implantation, thermal annealing, and other related unit processing steps. The precise sequencing and integration of the unit processing steps enables the formation of functional devices meeting desired performance metrics such as speed, power consumption, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

Combinatorial processing for plasma-based technology generally requires a shield with an aperture or similar structure to define the site isolated region on the substrate surface. The shield must be located close to the substrate surface so that the site isolated region is well defined and so that the site isolated regions do not interact with one another. In cases where an RF bias is applied to the substrate, the close proximity of the shield and the substrate may lead to arcing or may lead to the formation of an unwanted plasma between the shield and the substrate. This will lead to loss of RF power for its intended purpose, for example affecting the RF/DC bias effect, and may cause damage on the surface of the substrate under the shield.

Therefore, there is a need to develop methods and apparatus that allow the use of RF bias in plasma-based technologies applied to a substrate in a site isolated manner wherein arcing and unwanted plasmas are suppressed.

SUMMARY OF THE DISCLOSURE

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments of the present invention, a shield is provided wherein the shield comprises a ceramic insulation material. The ceramic insulation material fills the space between the shield and the substrate surface and maintains a gap of less than about 2 mm and advantageously, less than about 1 mm. The shield may be directly connected to ground, or may further be connected to ground through a low-pass filter operable to prevent the loss of high frequency RF power through the shield to ground but allow the dissipation of charge from the shield to ground through a low frequency or DC signal. In some embodiments, the ceramic insulating material further comprises a removable ceramic insert. The ceramic insert may be used to select the size and pattern of the aperture. The ceramic insert further comprises a slot operable to isolate the bottom lip of the ceramic insert from the upper portion for a PVD deposition.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Figure 1:
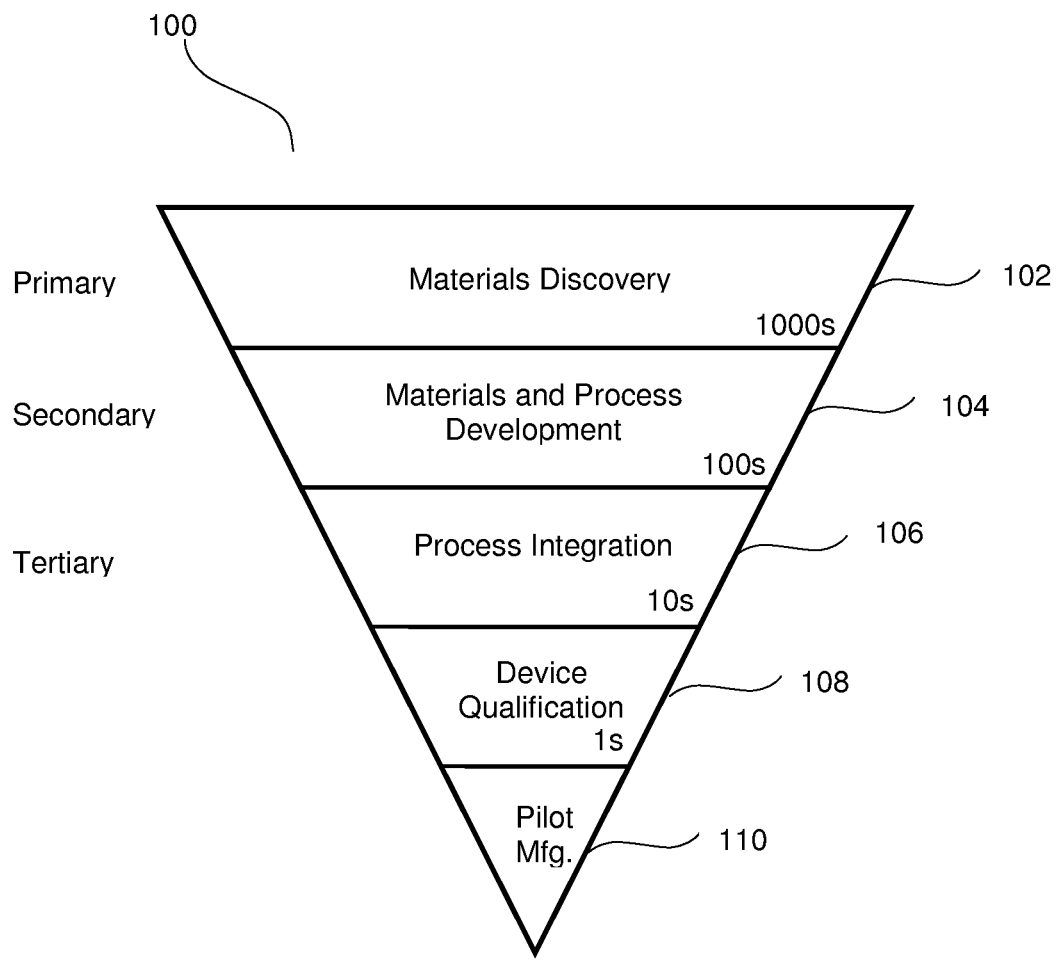
FIG. 1 illustrates a schematic diagram for implementing combinatorial processing and evaluation using primary, secondary, and tertiary screening.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of semiconductor devices, TFPV modules, optoelectronic devices, etc. manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a semiconductor devices, TFPV modules, optoelectronic devices, etc. device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture semiconductor devices, TFPV modules, optoelectronic devices, etc. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the semiconductor devices, TFPV modules, optoelectronic devices, etc. For example, such structures may include, but would not be limited to, contact layers, buffer layers, absorber layers, or any other series of layers or unit processes that create an intermediate structure found on semiconductor devices, TFPV modules, optoelectronic devices, etc. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
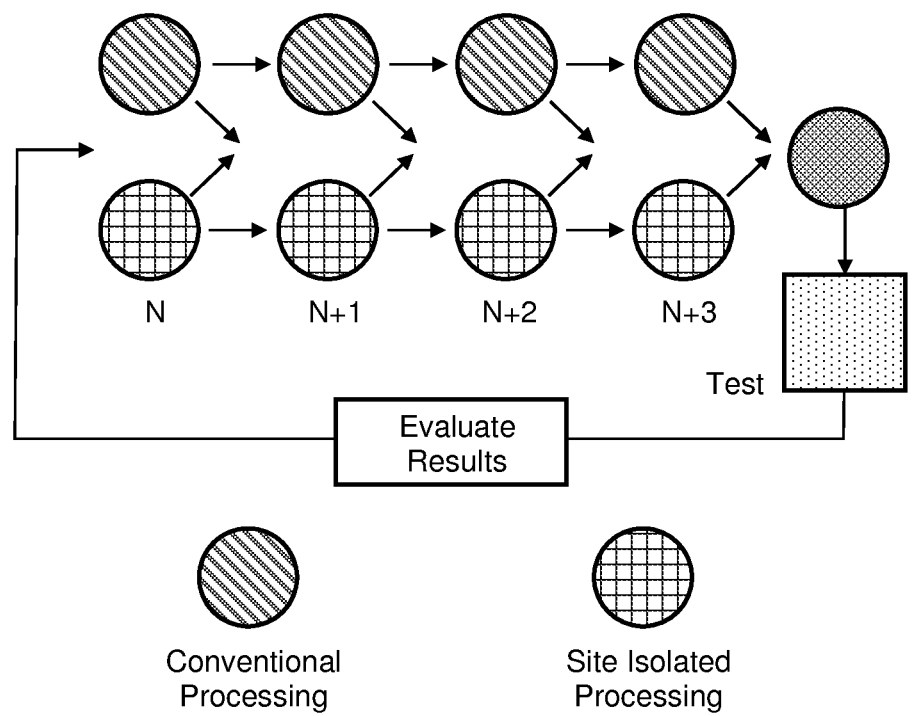
FIG. 2 is a simplified schematic diagram illustrating a general methodology for combinatorial process sequence integration that includes site isolated processing and/or conventional processing in accordance with some embodiments of the present invention.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor device, TFPV module, optoelectronic device, etc. manufacturing may be varied.

Figure 3:
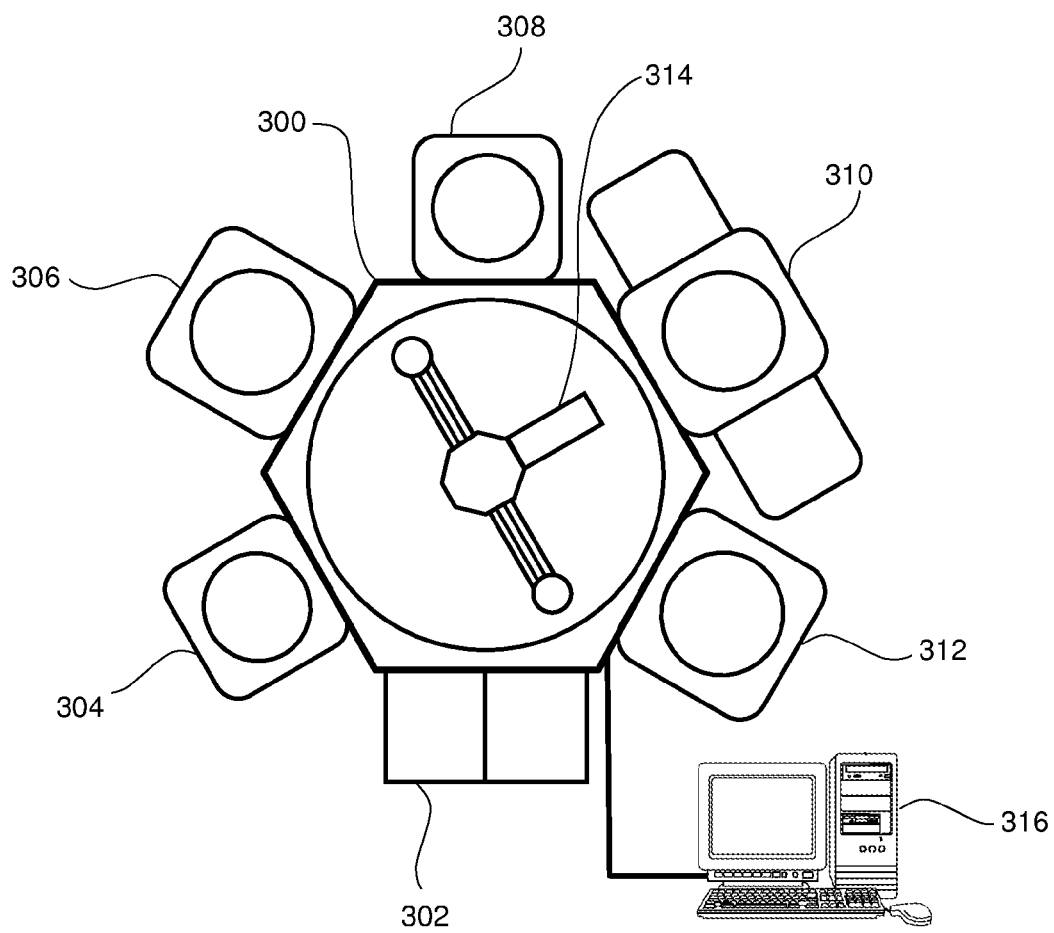
FIG. 3 is a simplified schematic diagram illustrating an integrated high productivity combinatorial (HPC) system in accordance with some embodiments of the present invention.

FIG. 3 is a simplified schematic diagram illustrating an integrated high productivity combinatorial (HPC) system in accordance with some embodiments of the invention. HPC system includes a frame 300 supporting a plurality of processing modules. It should be appreciated that frame 300 may be a unitary frame in accordance with some embodiments. In some embodiments, the environment within frame 300 is controlled. Load lock/factory interface 302 provides access into the plurality of modules of the HPC system. Robot 314 provides for the movement of substrates (and masks) between the modules and for the movement into and out of the load lock 302. Modules 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system, including the power supplies and synchronization of the duty cycles described in more detail below. Further details of one possible HPC system are described in U.S. application Ser. No. 11/672,478 filed Feb. 7, 2007, now U.S. Pat. No. 7,867,904 and claiming priority to U.S. Provisional Application No. 60/832,248 filed on Jul. 19, 2006, and U.S. application Ser. No. 11/672,473, filed Feb. 7, 2007 and claiming priority to U.S. Provisional Application No. 60/832,248 filed on Jul. 19, 2006, which are all herein incorporated by reference. With HPC system, a plurality of methods may be employed to deposit material upon a substrate employing combinatorial processes.

Figure 4:
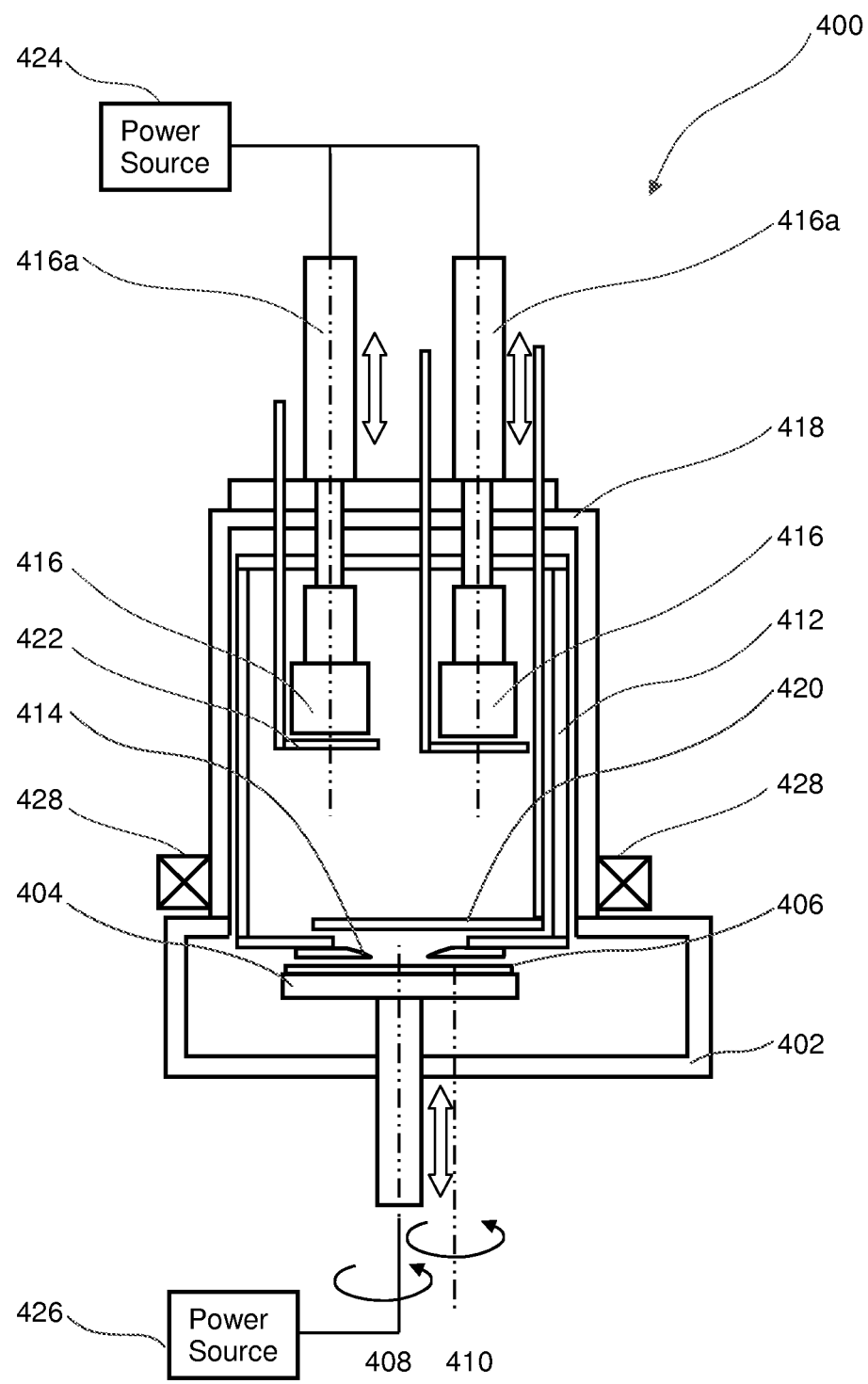
FIG. 4 is a simplified schematic diagram illustrating a sputter processing chamber configured to perform combinatorial processing and full substrate processing in accordance with some embodiments of the present invention.

FIG. 4 is a simplified schematic diagram illustrating a sputter chamber configured to perform combinatorial processing and full substrate processing in accordance with some embodiments of the invention. Processing chamber, 400, includes a bottom chamber portion, 402, disposed under top chamber portion, 418. Within bottom portion, 402, substrate support, 404, is configured to hold a substrate, 406, disposed thereon and can be any known substrate support, including but not limited to a vacuum chuck, electrostatic chuck or other known mechanisms. Substrate support, 404, is capable of both rotating around its own central axis, 408 (referred to as "rotation" axis), and rotating around an exterior axis, 410, (referred to as "revolution" axis). Such dual rotary substrate support is central to combinatorial processing using site-isolated mechanisms. Other substrate supports, such as an XY table, can also be used for site-isolated deposition. In addition, substrate support, 404, may move in a vertical direction. It should be appreciated that the rotation and movement in the vertical direction may be achieved through known drive mechanisms which include magnetic drives, linear drives, worm screws, lead screws, a differentially pumped rotary feed through drive, etc. Power source, 426, provides a bias power to substrate support, 404, and/or substrate, 406 through a matching network (not shown), and produces a negative bias voltage on substrate, 406 when a plasma is generated. In some embodiments power source, 426, provides a radio frequency (RF) power sufficient to take advantage of the high metal ionization to improve step coverage of vias and trenches of patterned wafers. In some embodiments, the RF power supplied by power source, 426, is pulsed and synchronized with the DC or DC pulsed power, or RF power, or DC-RF imposed power from power source, 424.

Substrate, 406, may be a conventional round 200 mm, 300 mm, or any other larger or smaller substrate/wafer size. In some embodiments, substrate, 406, may be a square, rectangular, or other shaped substrate. One skilled in the art will appreciate that substrate, 406, may be a blanket substrate, a coupon (e.g., partial wafer), or even a patterned substrate having predefined regions. In some embodiments, substrate, 406, may have regions defined through the processing described herein. The term region is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field a region may be, for example, a test structure, single die, multiple dies, portion of a die, other defined portion of substrate, or an undefined area of a substrate, e.g., blanket substrate which is defined through the processing.

Top chamber portion, 418, of chamber, 400, in FIG. 4 includes process kit shield, 412, which defines a confinement region over a radial portion of substrate, 406. Process kit shield, 412, is a sleeve having a base (optionally integrated with the shield) and an optional top within chamber, 400, that may be used to confine a plasma generated therein. The generated plasma will dislodge atoms from a target and the sputtered atoms will deposit on an exposed surface of substrate, 406, to combinatorial process regions of the substrate in some embodiments. In another embodiment, full wafer processing can be achieved by optimizing gun tilt angle and target-to-substrate spacing, and by using multiple process guns, 416. Process kit shield, 412, is capable of being moved in and out of chamber, 400, (i.e., the process kit shield is a replaceable insert). In another embodiment, process kit shield, 412, remains in the chamber for both the full substrate and combinatorial processing. Process kit shield, 412, includes an optional top portion, sidewalls and a base. In some embodiments, process kit shield, 412, is configured in a cylindrical shape, however, the process kit shield may be any suitable shape and is not limited to a cylindrical shape.

The base of process kit shield, 412, includes an aperture, 414, through which a surface of substrate, 406, is exposed for deposition or some other suitable semiconductor processing operations. The base of the process kit and the surface of the substrate are substantially parallel. Aperture shutter, 420, which is moveably disposed over the base of process kit shield, 412. Aperture shutter, 420, may slide across a bottom surface of the base of process kit shield, 412, in order to cover or expose aperture, 414, in some embodiments. In another embodiment, aperture shutter, 420, is controlled through an arm extension which moves the aperture shutter to expose or cover aperture, 414. It should be noted that although a single aperture is illustrated, multiple apertures may be included. Each aperture may be associated with a dedicated aperture shutter or an aperture shutter can be configured to cover more than one aperture simultaneously or separately. Alternatively, aperture, 414, may be a larger opening and aperture shutter, 420, may extend with that opening to either completely cover the aperture or place one or more fixed apertures within that opening for processing the defined regions. The dual rotary substrate support, 404, is central to the site-isolated mechanism, and allows any location of the substrate or wafer to be placed under the aperture, 414. Hence, the site-isolated deposition is possible at any location on the wafer/substrate.

A gun shutter, 422, may be included. Gun shutter, 422, functions to seal off a deposition gun when the deposition gun may not be used for the processing in some embodiments. For example, two process guns, 416, are illustrated in FIG. 4. Process guns, 416, are moveable in a vertical direction so that one or both of the guns may be lifted from the slots of the shield. While two process guns are illustrated, any number of process guns may be included, e.g., one, three, four or more process guns may be included. Where more than one process gun is included, the plurality of process guns may be referred to as a cluster of process guns. Gun shutter, 422, can be transitioned to isolate the lifted process guns from the processing area defined within process kit shield, 412. In this manner, the process guns are isolated from certain processes when desired. It should be appreciated that slide cover plate, 422, may be integrated with the top of the process kit shield, 412, to cover the opening as the process gun is lifted or individual cover plate, 422, can be used for each target. In some embodiments, process guns, 416, are oriented or angled so that a normal reference line extending from a planar surface of the target of the process gun is directed toward an outer periphery of the substrate in order to achieve good uniformity for full substrate deposition film. The target/gun tilt angle depends on the target size, target-to-substrate spacing, target material, process power/pressure, etc.

Top chamber portion, 418, of chamber, 400, of FIG. 4 includes sidewalls and a top plate which house process kit shield, 412. Arm extensions, 416a, which are fixed to process guns, 416, may be attached to a suitable drive, (i.e., lead screw, worm gear, etc.), configured to vertically move process guns, 416, toward or away from a top plate of top chamber portion, 418. Arm extensions, 416a, may be pivotally affixed to process guns, 416, to enable the process guns to tilt relative to a vertical axis. In some embodiments, process guns, 416, tilt toward aperture, 414, when performing combinatorial processing and tilt toward a periphery of the substrate being processed when performing full substrate processing. It should be appreciated that process guns, 416, may tilt away from aperture, 414, when performing combinatorial processing in another embodiment. In yet another embodiment, arm extensions, 416a, are attached to a bellows that allows for the vertical movement and tilting of process guns, 416. Arm extensions, 416a, enable movement with four degrees of freedom in some embodiments. Where process kit shield, 412, is utilized, the aperture openings are configured to accommodate the tilting of the process guns. The amount of tilting of the process guns may be dependent on the process being performed in some embodiments.

Power source, 424, provides power for sputter guns, 416, whereas power source, 426, provides RF bias power to an electrostatic chuck. As mentioned above, the output of power source, 426, is synchronized with the output of power source, 424. It should be appreciated that power source, 424, may output a direct current (DC) power supply, a direct current (DC) pulsed power supply, a radio frequency (RF) power supply or a DC-RF imposed power supply.

Figure 5A:
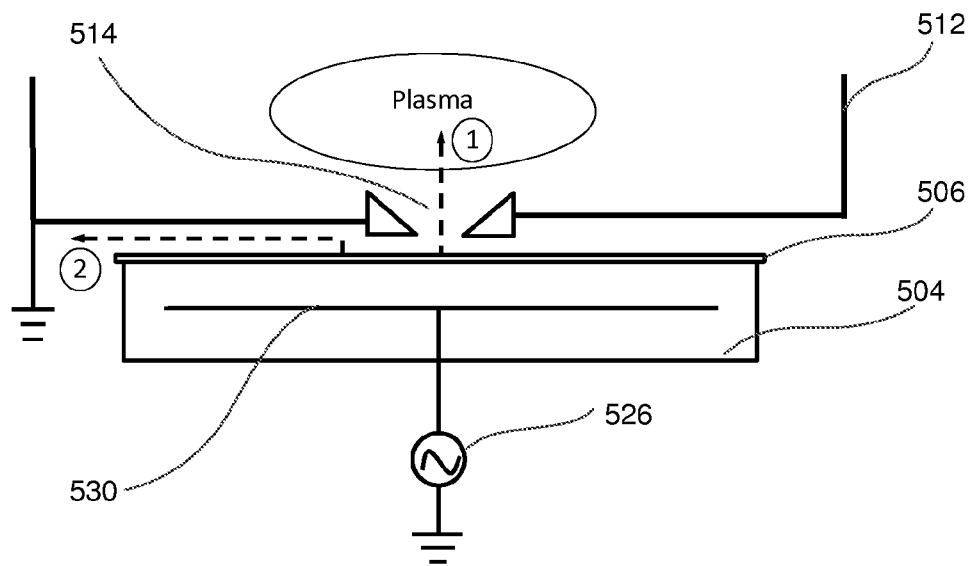
FIGS. 5A and 5B are simplified schematic diagrams illustrating a cross-section of the substrate support and aperture and an equivalent circuit diagram.
Figure 5B:
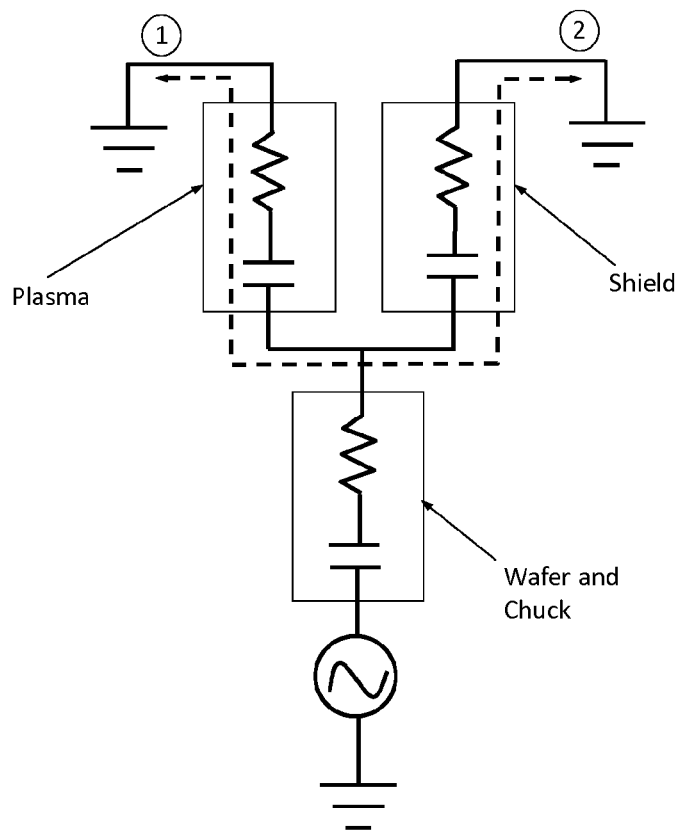

FIG. 5A is a simplified schematic diagram illustrating a cross-section of the substrate support and aperture. Similar to FIG. 4, the base of the process kit shield, 512, comprises an aperture, 514. The process kit shield is typically formed from a conductive material. A substrate, 506, is supported on the substrate support, 504. A power supply, 526, is connected to an electrode, 530 through a matching network (not shown), incorporated into the substrate support and is used to apply RF bias voltage to the substrate support and/or substrate. The frequency of the RF bias voltage may vary between about 300 k Hz and about 60 MHz. An equivalent electrical circuit is illustrated in FIG. 5B wherein the substrate support and substrate, the shield, and the plasma are all represented by simple resistor-capacitor (RC) circuit elements. Typically, the application of RF bias voltage to a substrate was developed for use in conventional plasma processing chambers. In conventional plasma processing chambers, there is not a shield held at ground potential disposed close to the substrate surface as illustrated in FIG. 5A. However, for combinatorial processing, the base of the process kit shield, 512, comprising aperture, 514, is required to generate the isolated sites on the substrate surface. The goal is to restrict the effects of the RF bias only to the site isolated region below the aperture. The presence of the base of the process kit shield, 512, close to the substrate surface gives two paths for the applied RF power to go to ground. The first path would be the typical path where the applied RF power couples to the plasma generated within the process chamber. This is illustrated as path "1" in FIGS. 5A and 5B. The second path would be through a plasma generated between the substrate surface and the base of the process kit shield, 512. This is illustrated as path "2" in FIGS. 5A and 5B. In practice, path "2" represents the lowest impedance path to ground and most of the power would be coupled to ground through path "2". Those skilled in the art will understand that a plasma formed between the substrate surface and the base of the process kit shield, 512, would be undesirable. Firstly, much of the RF power applied to the substrate would be directed away from the region under the aperture, 514, and the benefits of the RF bias voltage would not be realized. Secondly, the plasma formed between the substrate surface and the base of the process kit shield would damage regions of the substrate that were not intended to be processed (i.e. those regions not under the aperture).

Figure 6A:
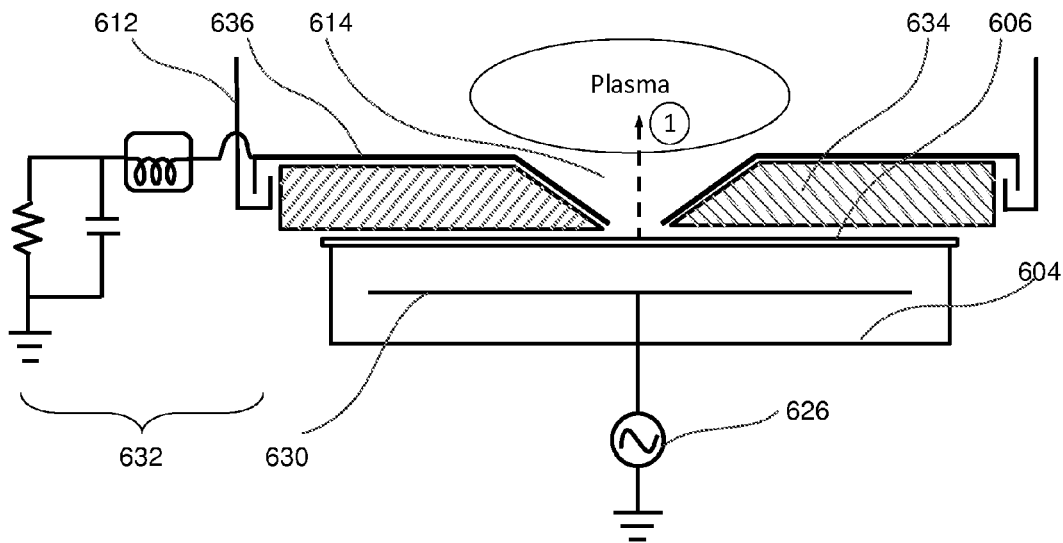
FIGS. 6A and 6B are simplified schematic diagrams illustrating a cross-section of the substrate support and aperture and an equivalent circuit diagram.
Figure 6B:
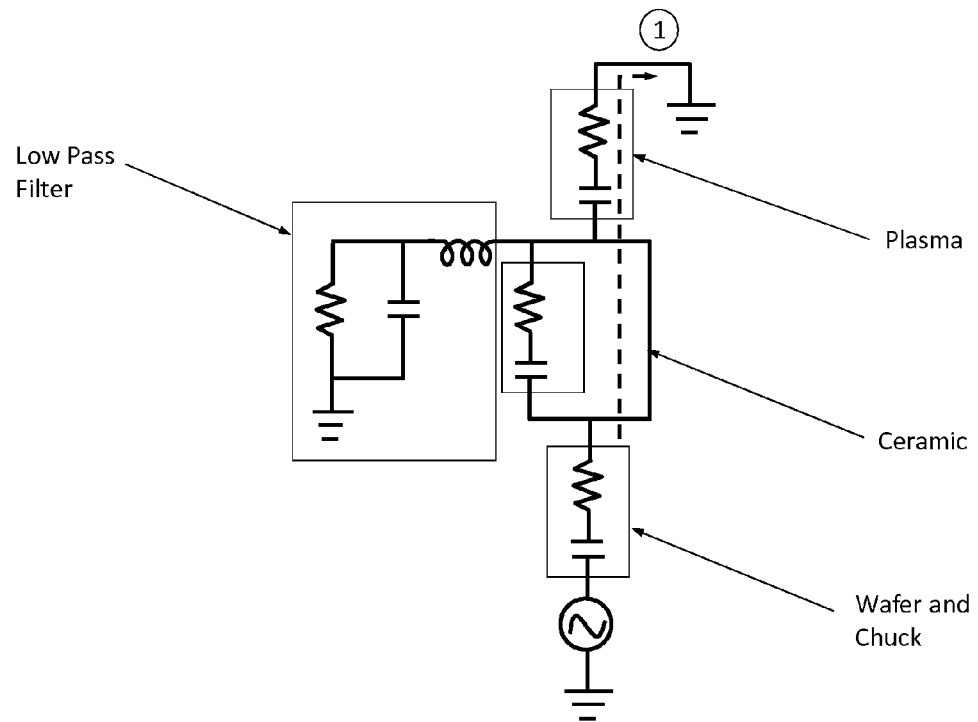

FIG. 6A is a simplified schematic diagram illustrating a cross-section of the substrate support and aperture. The process shield kit has been separated into an upper part, 612, and a base, 636. The base of the process kit shield, 636, comprises an aperture, 614. The process kit shield is typically formed from a conductive material. The base of the process kit shield, 636, further comprises a ceramic insulation material, 634, disposed between the base of the process kit shield, 636, and the substrate surface. The ceramic insulation material fills the space between the base of the process kit shield, 636, and the substrate surface. The resulting gap can be maintained to less than about 2 mm and advantageously less than about 1 mm. A low-pass filter, 632, has been inserted between the base of the process kit shield, 636, and ground. The low-pass filter is operable to block high frequency power from passing through to ground, but will allow low frequency power or DC power to pass through to the ground. The low-pass filter also prevents the base of the process kit shield, 636, from accumulating a charge. Those skilled in the art will understand that the frequency cut-off for the low-pass filter can be selected through the choice of the values of the inductor, resistor, and capacitor used to form the circuit. The base of the process kit shield, 636, can also be connected to the upper shield which is held at ground potential, however, the low-pass filter is advantageous. A substrate, 606, is supported on the substrate support, 604. A power supply, 626, is connected to an electrode, 630 through a matching network (not shown), incorporated into the substrate support and is used to apply RF bias voltage to the substrate support and/or substrate. The frequency of the RF bias voltage may vary between about 300 k Hz and about 60 MHz. An equivalent electrical circuit is illustrated in FIG. 6B wherein the substrate support and substrate, the shield with the ceramic, and the plasma are all represented by simple resistor-capacitor (RC) circuit elements. Typically, the application of RF bias voltage to a substrate was developed for use in conventional plasma processing chambers. In these chambers, there is not a shield held at ground potential disposed close to the substrate surface as illustrated in FIG. 6A. However, for combinatorial processing, the base of the process kit shield, 612, comprising aperture, 614, is required to generate the isolated sites on the substrate surface. The goal is to restrict the effects of the RF bias only to the site isolated region below the aperture. The implementation of the base of the process kit shield, 636, with the ceramic insulation material, and the low-pass filter connected to the base leaves only a single path for the applied RF power to go to ground. The path would be the typical path where the applied RF power couples to the plasma generated within the process chamber. This is illustrated as path "1" in FIGS. 6A and 6B. The implementation of the base of the process kit shield, 636, with the ceramic insulation material, and the low-pass filter connected to the base has been described with relation to a PVD application, however, those skilled in the art will understand that this configuration is also applicable to plasma-etch, plasma enhanced chemical vapor deposition (PECVD), or plasma enhanced atomic layer deposition (PEALD) applications configured for high productivity combinatorial deposition. The use of PVD as an example does not limit the scope of the present invention.

Figure 7A:
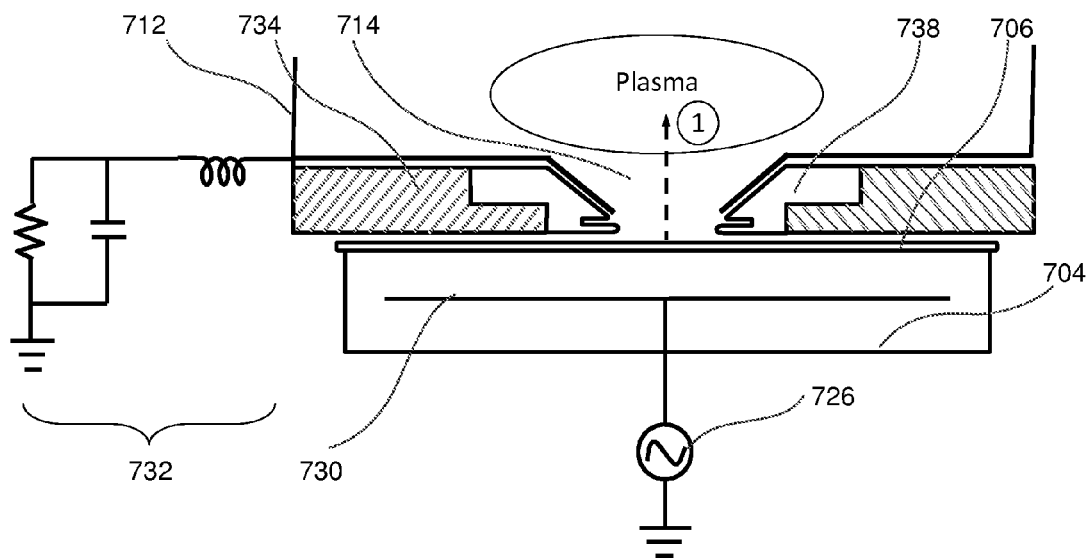
FIGS. 7A and 7B are simplified schematic diagrams illustrating a cross-section of the substrate support and details of the ceramic insert.

The edge of the aperture may induce arching between the base shield and the substrate. FIG. 7A is a simplified schematic diagram illustrating a cross-section of the substrate support and aperture. The process shield kit, 712, has been illustrated as a single piece. However, the process shield kit, 712, may be separated into the configuration as discussed with reference to FIG. 6A. The base of the process kit shield, 712, comprises an aperture, 714. The process kit shield is typically formed from a conductive material. The base of the process kit shield, 712, further comprises a ceramic insulation material, 734, disposed between the base of the process kit shield, 712, and the substrate surface. The ceramic insulation material fills the space between the base of the process kit shield, 712, and the substrate surface. The resulting gap can be maintained to less than about 2 mm and advantageously less than about 1 mm. A low-pass filter, 732, has been inserted between the base of the process kit shield, 712, and ground. The low-pass filter is operable to block high frequency power from passing through to ground, but will allow low frequency power or DC power to pass through to the ground. The low-pass filter also prevents the base of the process kit shield, 712, from accumulating a charge. Those skilled in the art will understand that the frequency cut-off for the low-pass filter can be selected through the choice of the values of the inductor, resistor, and capacitor used to form the circuit. A substrate, 706, is supported on the substrate support, 704. A power supply, 726, is connected to an electrode, 730 through a matching network (not shown), incorporated into the substrate support and is used to apply RF bias voltage to the substrate support and/or substrate. The frequency of the RF bias voltage may vary between about 300 k Hz and about 60 MHz. Typically, the application of RF bias voltage to a substrate was developed for use in conventional plasma processing chambers. In these chambers, there is not a shield held at ground potential disposed close to the substrate surface as illustrated in FIG. 7A. However, for combinatorial processing, the process kit shield, 712, comprising aperture, 714, is required to generate the isolated sites on the substrate surface. The goal is to restrict the effects of the RF bias only to the site isolated region below the aperture. The implementation of the process kit shield, 712, with the ceramic insulation material, and the low-pass filter connected to the base leaves only a single path for the for the applied RF power to go to ground. The path would be the typical path where the applied RF power couples to the plasma generated within the process chamber. This is illustrated as path "1" in FIG. 7A.

Figure 7B:
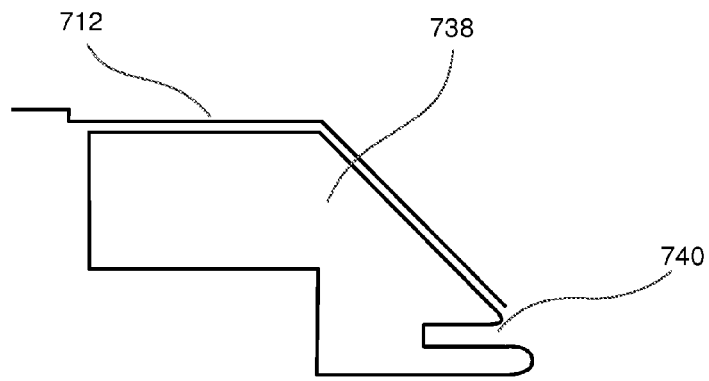

It may be advantageous to have apertures of different sizes. In FIG. 7A, the ceramic insulation material further comprises a ceramic insert, 738, disposed at the edge of the aperture. The ceramic insert protrudes into the area defined by the aperture. The ceramic insert may be removable and allow the selection of different sizes and pattern for the aperture opening. When implemented for a PVD application, the exposed edge of the ceramic insert may become coated with material and may induce arching. To prevent arching, the ceramic insert may comprise a slot, 740, as illustrated in FIG. 7B. A long dimension of the slot may be parallel to the plane of the bottom surface of the shield. Particularly for PVD, the deposition proceeds in a "line-of-sight" manner from the target to the substrate. Therefore, the slot ensures that the lower portion of the groove is not electrically connected to the upper portion and the shield and will prevent arcing.

Although the foregoing examples have been described in some detail for purposes of clarity of understanding, the invention is not limited to the details provided. There are many alternative ways of implementing the invention. The disclosed examples are illustrative and not restrictive.

What is claimed:

1. An apparatus for applying a radio frequency bias to a substrate in a sputtering system configured for combinatorial processing of the substrate, the apparatus comprising:
   a substrate support for supporting the substrate during combinatorial processing,
      wherein the substrate support comprises an electrode for connecting to a power supply and applying the radio frequency bias to the substrate during combinatorial processing;
   a shield,
      wherein the shield comprises an aperture formed by a bottom edge of the shield,
      wherein the aperture is operable to define each of multiple site isolated regions on a surface of the substrate disposed under the aperture for combinatorially processing the multiple site isolated regions,
      wherein each of the multiple site isolated regions is smaller than the substrate, and
      wherein the shield is formed from a conductive material;
   a ceramic insulation material disposed between a portion of the shield and the substrate support,
      wherein the ceramic insulation material comprises an opening defining each of the multiple site isolated regions,
      wherein the bottom edge of the shield protrudes into the opening of the ceramic insulation material and is positioned closer to the substrate support than the portion of the shield,
      wherein the portion of the shield and the substrate support are substantially parallel during combinatorial processing such that the portion of the shield protects the substrate except one of the multiple site isolated regions position under the aperture of the shield during combinatorial processing; and
   a low-pass filter connected to the shield for dissipation of charge from the shield to ground through a low frequency or DC signal.

2. The apparatus of claim 1, wherein a gap between the ceramic insulation material and the substrate during combinatorial processing is less than about 2 mm.

3. The apparatus of claim 2, wherein a gap between the ceramic insulation material and the substrate during combinatorial processing is less than about 1 mm.

4. The apparatus of claim 1, wherein the radio frequency bias applied to the substrate during combinatorial processing has a frequency between about 300 kHz and about 60 MHz.

5. The apparatus of claim 1, wherein the ceramic insulation material further comprises a ceramic insert, wherein the ceramic insert forms the aperture in the ceramic insulation material.

6. The apparatus of claim 5, wherein the ceramic insert further comprises a slot, wherein a long dimension of the slot is parallel to a plane of the portion of the shield.

7. The apparatus of claim 6, wherein the ceramic insert is removable.

8. The apparatus of claim 1, wherein the shield comprises a base and an upper part, the upper part extending substantially normal to the base, the base comprising the aperture.

9. The apparatus of claim 1, wherein the substrate support is movable with respect to the aperture to define the multiple site isolated regions on the surface of the substrate.

10. The apparatus of claim 9, wherein the substrate support is rotatable around a central axis of the substrate support and rotatable around a revolution axis.

11. A process chamber for combinatorial processing of a substrate while applying a radio frequency bias to the substrate, the process chamber comprising:
   a support,
      the support operable to support a substrate during combinatorial processing
      wherein the substrate support comprises an electrode for connecting to a power supply and applying the radio frequency bias to the substrate during combinatorial processing;
   a power supply,
      the power supply operable to provide radio frequency power to the support;

a shield,
- wherein the shield comprises an aperture formed by a bottom edge of the shield,
- wherein the aperture is operable to define each of multiple site isolated regions on a surface of the substrate disposed under the aperture for combinatorially processing the multiple site isolated regions,
- wherein each of the multiple site isolated regions is smaller than the substrate, and
- wherein the shield is formed from a conductive material;

a ceramic insulation material disposed between a portion of the shield and the substrate support,
- wherein the ceramic insulation material comprises an opening defining each of the multiple site isolated regions,
- wherein the bottom edge of the shield protrudes into the opening of the ceramic insulation material and is positioned closer to the substrate support than the portion of the shield,
- wherein the portion of the shield and the substrate support are substantially parallel during combinatorial processing such that the portion of the shield protects the substrate except one of the multiple site isolated regions position under the aperture of the shield during combinatorial processing; and a low-pass filter connected to the shield for dissipation of charge from the shield to ground through a low frequency or DC signal.

12. The process chamber of claim 11, wherein a gap between the ceramic material and the substrate is less than about 2 mm during combinatorial processing.

13. The process chamber of claim 12, wherein a gap between the ceramic material and the substrate is less than about 1 mm during combinatorial processing.

14. The process chamber of claim 11, wherein the radio frequency bias has a frequency between about 300 kHz and about 60 MHz during combinatorial processing.

15. The process chamber of claim 11, wherein the ceramic insulation material further comprises a ceramic insert, wherein the ceramic insert forms the aperture.

16. The process chamber of claim 15, wherein the ceramic insert further comprises a slot, wherein a long dimension of the slot is parallel to a plane of the portion of the shield.

17. The process chamber of claim 16, wherein the ceramic insert is removable.

* * * * *